United States Patent
Fujii

(10) Patent No.: US 6,834,185 B2
(45) Date of Patent: Dec. 21, 2004

(54) RADIO RECEIVER AND RADIO RECEIVING METHOD

(75) Inventor: Hideo Fujii, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 659 days.

(21) Appl. No.: 09/958,117

(22) PCT Filed: Feb. 19, 2001

(86) PCT No.: PCT/JP01/01153

§ 371 (c)(1),
(2), (4) Date: Oct. 4, 2001

(87) PCT Pub. No.: WO01/61844

PCT Pub. Date: Aug. 23, 2001

(65) Prior Publication Data

US 2002/0160735 A1 Oct. 31, 2002

(30) Foreign Application Priority Data

Feb. 17, 2000 (JP) ........................................ 2000-039544

(51) Int. Cl.$^7$ ................................................ H04B 1/06
(52) U.S. Cl. .............................. 455/232.1; 455/550.1; 455/561
(58) Field of Search ............................. 455/232.1, 525, 455/526, 67.11, 73, 550.1, 553.1, 556.1, 561

(56) References Cited

U.S. PATENT DOCUMENTS 5,331,638 A * 7/1994 Honkasalo et al. ......... 370/347

FOREIGN PATENT DOCUMENTS

| JP | 55044225 | 3/1980 |
| JP | 58050811 | 3/1983 |
| JP | 59226525 | 12/1984 |
| JP | 08274558 | 10/1996 |
| JP | 08274708 | 10/1996 |
| JP | 10056343 | 2/1998 |

OTHER PUBLICATIONS

Huttunen et al. ; Reception method and Receiver; Jul. 8, 1999; WO 99/34506.*

European Search Report dated May 19, 2004.

International Search Report dated Jun. 5, 2001.

* cited by examiner

*Primary Examiner*—Melur Ramakrishnaiah
(74) *Attorney, Agent, or Firm*—Stevens, Davis, Miller & Mosher, LLP

(57) ABSTRACT

A data portion measuring section 103 measures a reception level of a data portion of a received signal, and a pilot portion measuring section 104 measures a reception level of a pilot portion of the received signal. A comparing/selecting section 105 compares the reception level of the data portion with that of the pilot portion, and selects a higher reception level. An AGC gain value calculating section 106 calculates an AGC gain value from the higher reception level selected by the comparing/selecting section 105 and an input allowable level of A/D conversion.

8 Claims, 3 Drawing Sheets

RADIO RECEIVER AND RADIO RECEIVING METHOD

TECHNICAL FIELD

The present invention relates to a radio receiving apparatus and a radio receiving method, and particularly to a radio receiving apparatus and a radio receiving method, which perform AGC (Auto Gain Control) to a received signal.

BACKGROUND ART

AS conventional AGC, one that can follow gentle and sharp variations in the level of a received signal due to fading by use of two kinds of time constants as disclosed in Unexamined Japanese Patent Publication HEI 8-274558. Also, the conventional AGC is performed based on an average level for one slot of the received signal.

However, performance of AGC based on the average level for one slot includes a problem in which an appropriate AGC gain value cannot be calculated when a data portion and a pilot portion (known signal portion), each having a different reception level, exist in one slot. Namely, in the TDD (Time Division Duplex) radio communication system where each of a reception channel and a transmission channel is assigned to a different time slot, the data portion normally accounts for about 4/5 in one slot. Hence, when the reception level of the pilot portion is higher than that of the data portion, the reception level of the pilot portion becomes higher than the average level of one slot. As a result, the level of the pilot portion subjected to AGC is clipped in some cases.

When such clipping occurs in this way, demodulation cannot be correctly performed. Since the pilot portion is used to estimate the propagation path characteristic, occurrence of clipping with respect to the pilot portion makes it impossible to estimate/compensate for phase variation of the data portion and amplitude variation thereof, with the result that not only the pilot portion but also the data portion cannot be correctly demodulated.

Additionally, clipping refers to the point in which the reception level of the received signal exceeds an input allowable range of A/D conversion, whereby preventing appropriate A/D conversion from being provided to the received signal that has exceeded the allowable range and resulting in the lost of a part of data.

DISCLOSURE OF INVENTION

An object of the present invention is to provide a radio receiving apparatus and a radio receiving method, which can calculate such an appropriate level control value (AGC gain value) that prevents occurrence of clipping to perform demodulation correctly even if portions each having a different reception level exist in a transmission unit (one slot).

In order to attain the above object, the present invention is configured to calculate a level control value using the highest reception level when a plurality of portions each having a different reception level exists in a transmission unit (one slot). This makes it possible to prevent clipping from being generated by AGC.

BEST MODE FOR CARRYING OUT THE INVENTION

Embodiments of the present invention will be specifically explained with reference to the drawings attached herewith.

(Embodiment 1)

Figure 1:
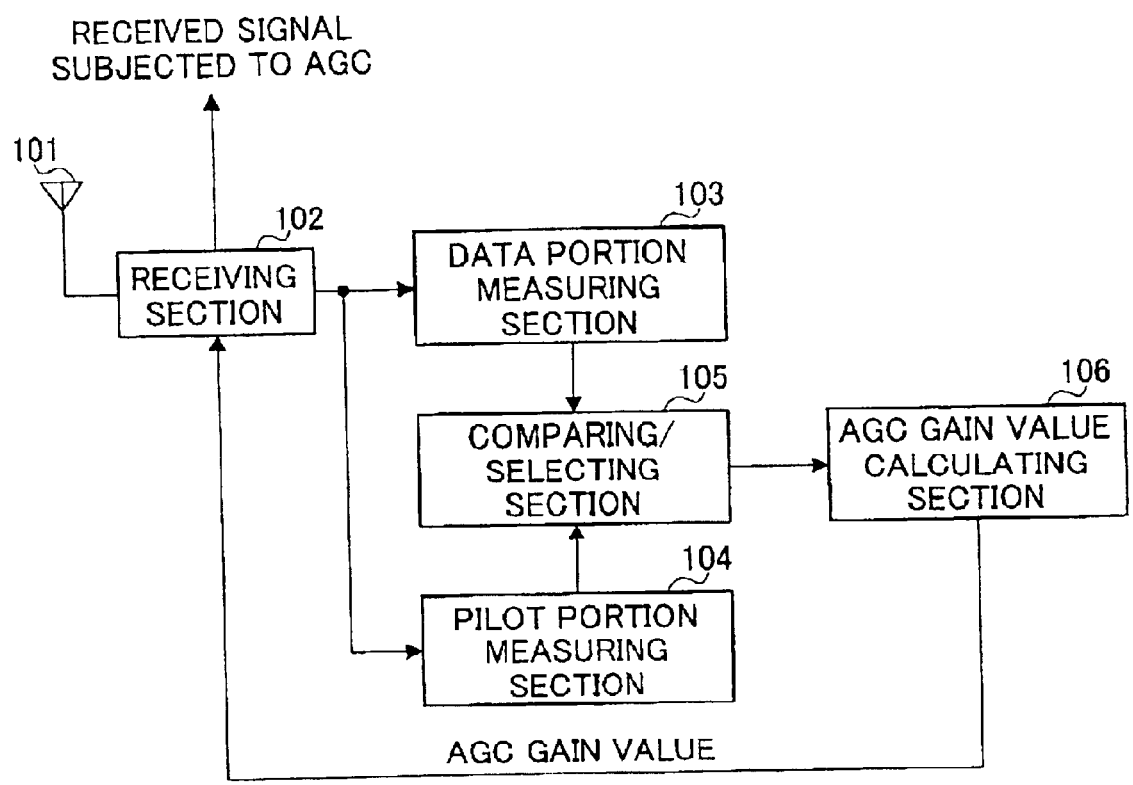
FIG. 1 is a block diagram illustrating the configuration of the radio receiving apparatus according to Embodiment 1 of the present invention.

FIG. 1 is a block diagram illustrating the configuration of the radio receiving apparatus according to Embodiment 1 of the present invention. In the radio receiving apparatus illustrated in FIG. 1, a receiving section 102 provides predetermined reception processing such as down-converting to a signal received via an antenna 101. The signal subjected to reception processing is outputted to a data portion measuring section 103 and a pilot portion measuring section 104.

The receiving section 102 controls the level of the received signal in accordance with an AGC gain value (level control value) calculated by an AGC gain value calculating section 106 to be described later. In other words, the receiving section 102 performs AGC to the received signal. The level of the received signal stays within the input allowable range of A/D conversion by this AGC. The specific explanation of AGC will be described later.

The data portion measuring section 103 measures the reception level of the data portion of the received signal. The data portion measuring section 103 uses an average value of the reception levels of a plurality of data contained in one slot as a reception level of the data portion in order to improve the accuracy of measurement. The reception level of the data portion is outputted to a comparing/selecting section 105.

The pilot portion measuring section 104 measures the reception level of the pilot portion of the received signal. The pilot portion measuring section 104 uses an average value of the reception levels of a plurality of pilot signals contained in one slot as a reception level of the pilot portion in order to improve the accuracy of measurement. The reception level of the pilot portion is outputted to the comparing/selecting section 105.

The comparing/selecting section 105 compares the reception level of the data portion with that of the pilot portion and selects a higher reception level. The selected reception level is outputted to an AGC gain value calculating section 106.

The AGC gain value calculating section 106 calculates an AGC gain value from the higher reception level selected by the comparing/selecting section 105 and the input allowable level of A/D conversion. The method for calculating the AGC gain value will be described later. The calculated AGC gain value is outputted to the receiving section 102.

Figure 2A:
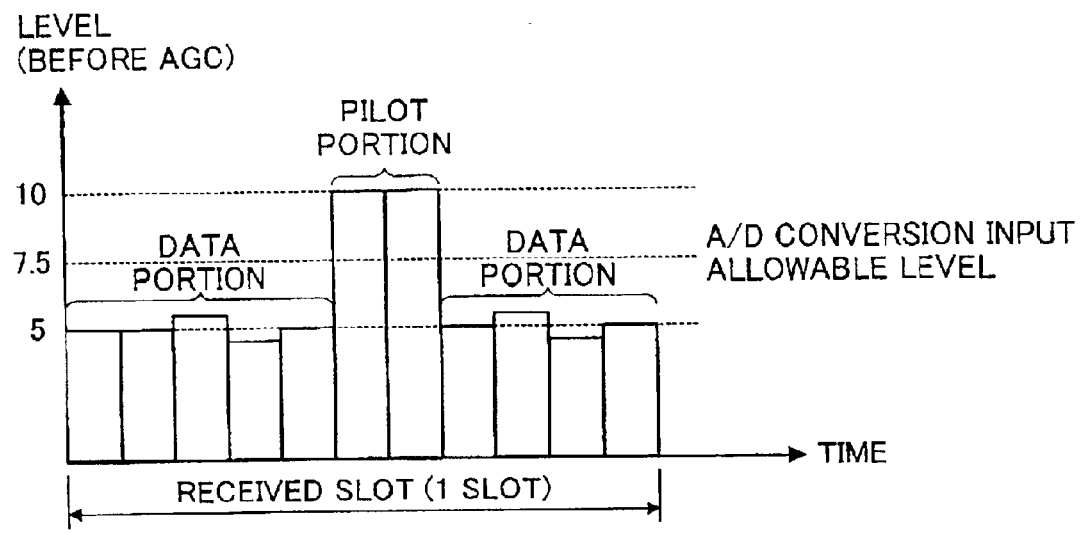
FIG. 2A is a schematic view illustrating the reception level (before AGC) of a pilot portion and the reception level (before AGC) of a data portion.
Figure 2B:
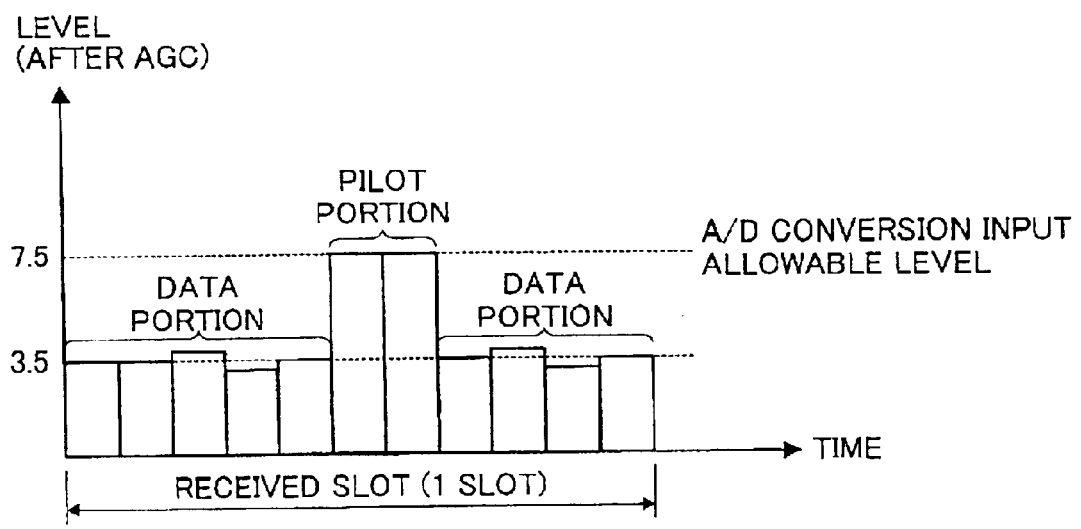
FIG. 2B is a schematic view illustrating the reception level (after AGC) of the pilot portion and the reception level (after AGC) of the data portion.

An explanation will be next given of the operation of the radio receiving apparatus having the aforementioned configuration with reference to FIG. 2A and FIG. 2B. Herein, the following will explain a case in which the radio receiving apparatus of this embodiment is used in CDMA/TDD (Code Division Multiple Access/Time Division Duplex) radio communication system.

In CDMA/TDD system, since the number of codes to be multiplexed in one slot is relatively small, the level of the pilot portion becomes higher than that of the data portion in some cases by DTX (Discontinuous Transmission) control that transmits no data when there is no data to be transmitted. As mentioned above, in the TDD radio communication system, the data portion normally accounts for about 4/5 in one slot. Accordingly, the reception level of the received signal in one slot becomes uneven as illustrated in FIG. 2A. Herein, it is assumed that the reception level of the pilot portion is 10 and the reception level of the data portion is 5. Also, it is assumed that the input allowable level of A/D conversion is 7.5.

Here, in the aforementioned conventional AGC, since the AGC gain value is calculated based on the average level of one slot, the level of the pilot portion subjected to AGC is clipped when the reception level in one slot reaches as illustrated in FIG. 2A. Namely, in the example shown in FIG. 2A, the average level of one slot becomes 6, and the AGC gain value becomes 1.25. Accordingly, the level of the pilot portion subjected to AGC becomes 12.5, and is clipped.

For this reason, according to the radio receiving apparatus of this embodiment, as mentioned above, the comparing/selecting section 105 compares the reception level of the data portion with that of the pilot portion, and the AGC gain value calculating section 106 calculates the AGC gain value using the higher reception level. Namely, in the example illustrated in FIG. 2A, the AGC gain value calculating section 106 calculates the AGC gain value using the reception level (average value) of the pilot portion. Since the reception level (average value) of the pilot portion is 10, the AGC gain value calculated by the AGC gain value calculating section 106 becomes 0.75.

Accordingly, by AGC performed by the receiving section 102, the level of the pilot portion becomes 7.5 and the level of the data portion becomes 3.5 as illustrated in FIG. 2B and they stay within the input allowable level of A/D conversion. Namely, according to this embodiment, clipping can be prevented from being generated in both the pilot portion and the data portion.

As mentioned above, according to this embodiment, since the generation of clipping can be prevented, appropriate AGC can be carried out, so that high quality of communication can be obtained.

The above has explained the case in which the reception level of the pilot portion is higher than that of the data portion as one example. This embodiment, however, can be similarly carried out even in the case in which the reception level of the data portion is higher than that of the pilot portion.

Moreover, the above has explained the case in which TDD system is used as example. This embodiment, however, can be similarly carried out even in the FDD (Frequency Division Duplex) radio communication system.

Still moreover, this embodiment is particularly useful in the case in which the number of codes to be multiplexed changes in the CDMA/TDD radio communication system as mentioned above.

As other case in which the number of codes to be multiplexed changes in the CDMA/TDD system, there is a case in which the number of kinds of transmission data changes in performing multi-code transmission (for example, a case in which only a speech signal is transmitted in place of the case in which both an image signal and a speech signal). Furthermore, in the CDMA/TDD system, there is a case in which a common pilot signal of each communication partner is transmitted or a common pilot signal of each data is transmitted so that the transmission level of the pilot signal is maintained constant regardless of the number of codes to be multiplexed. Namely, in the CDMA/TDD system, even though the reception level of the pilot portion is constant, the reception level of the data portion changes, so that a difference in the reception level is generated between both portions in some cases.

If AGC is performed base on the average level of one slot in such a case, the same problem as mentioned above occurs. For this reason, AGC using the radio receiving apparatus of this embodiment is useful in the case in which the number of codes to be multiplexed changes in the CDMA/TDD radio communication system.

(Embodiment 2)

Depending on the communication condition, there are cases including one in which the reception level of the pilot portion and that of the data portion are different from each other and the other in which both reception levels are the same as each other. For example, in the CDMA/TDD system, when the common pilot signal of each communication partner is used, since the level of the pilot portion is constant regardless of the number of codes to be multiplexed, the change in the number of codes to be multiplexed generates a difference in the reception level between both portions. On the other hand, when the pilot signal, having the same level as that of the data portion, is transmitted to each of the communication partners, the level of the pilot portion changes corresponding to the change of the number of codes to be multiplexed. As a result, the reception levels of both portions become the same as each other even if the number of codes to be multiplexed changes.

In the case where the reception levels of both portions are different from each other, the generation of clipping can be prevented by performing AGC as in the aforementioned Embodiment 1. In the case where the reception levels of both portions are the same as each other, it is unnecessary to perform comparison/selection as explained in Embodiment 1 since there is no difference between the reception levels of both portions.

As mentioned above, in the TDD radio communication system, the data portion normally accounts for about 4/5 in one slot. Hence, in the case where the reception levels of both portions are the same as each other, the average value of the reception levels obtained without including the reception level of the pilot portion is nearly same as that of the reception levels including the reception level of the pilot portion.

For this reason, according to this embodiment, it is determined from the current communication condition as to whether the reception level of the data portion becomes the same as that of the pilot portion. When it is determined that the reception levels of both portions become the same as each other, the AGC gain value is calculated using only the reception level of the data portion. This makes it possible to omit the comparison/selection and the measurement of the reception level of the pilot portion without reducing the accuracy of AGC, and to reduce the amount of processing relating to AGC.

Figure 3:
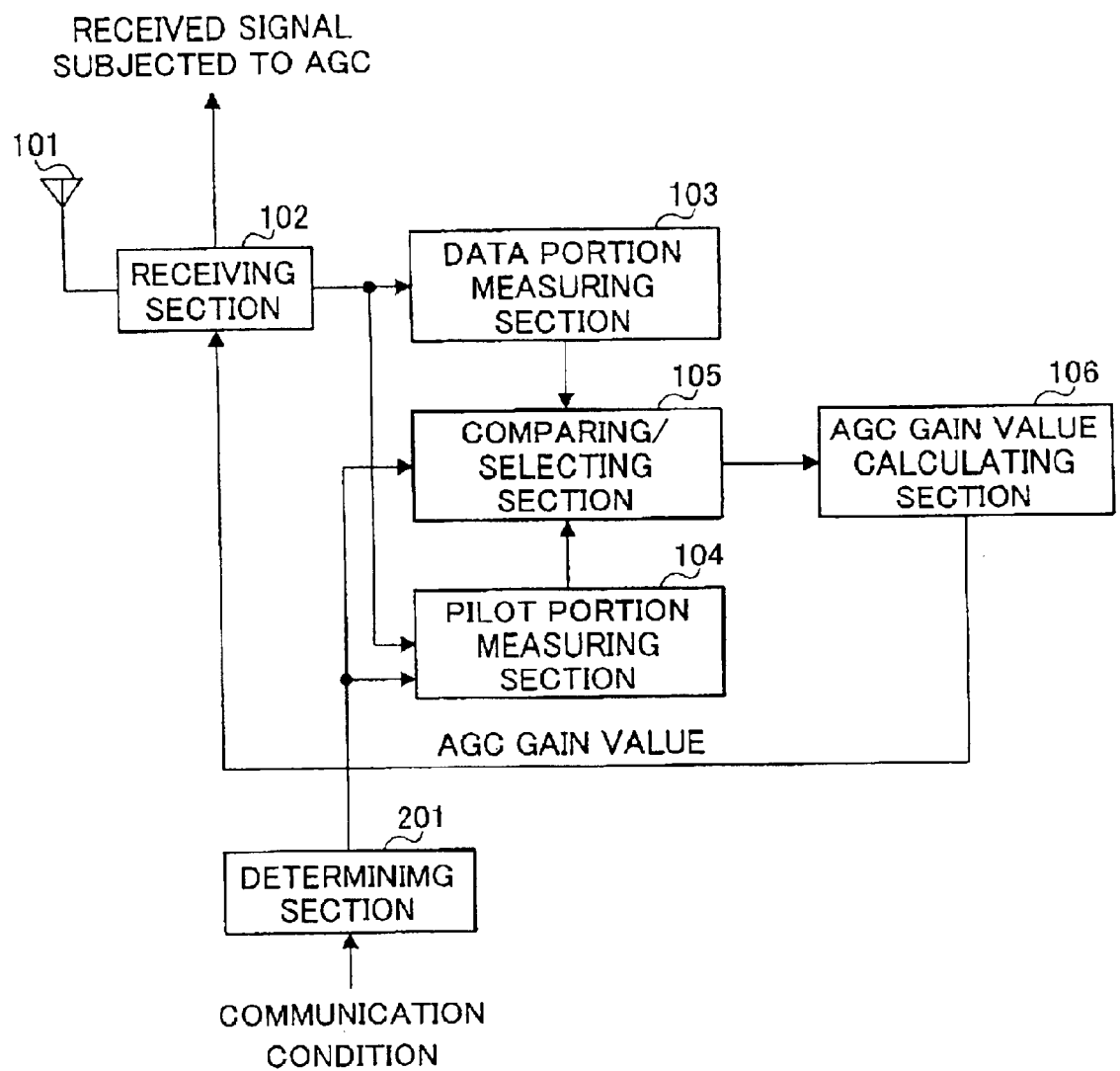
FIG. 3 is a block diagram illustrating the configuration of the radio receiving apparatus according to Embodiment 2 of the present invention.

FIG. 3 is a block diagram illustrating the configuration of the radio receiving apparatus according to Embodiment 2 of the present invention. Additionally, in FIG. 3, the same reference numerals as those of FIG. 1 are added to the portions each having the same configuration as that of Embodiment 1, and the specific explanation is omitted.

In the radio receiving apparatus illustrated in FIG. 3, a determining section 201 determines as to whether the reception level of the data portion becomes the same as that of the pilot portion based on information, which is inputted from an upper layer than a physical layer to indicate the current communication condition.

When the determining section 201 determines that the reception levels of both portions become the same as each other, the determining section 201 outputs a control signal to the pilot portion measuring section 104 and the comparing/selecting section 105 to stop their operations. When the control signal is outputted, the pilot portion measuring section 104 does not measure the reception level of the pilot portion. Also, when the control signal is outputted, the comparing/selecting section 105 directly outputs the average value of the reception levels of the data portion outputted from the data portion measuring section 103 to the AGC gain value calculating section 106. Whereby, in the case where the reception levels of both portions become the same as each other, the AGC gain value calculating section 106 calculates the AGC gain value using only the reception level of the data portion.

When the determining section 201 determines that the reception levels of both portions are different from each other, the determining section 201 outputs a control signal to the pilot portion measuring section 104 and the comparing/selecting section 105 to perform their operations. Accordingly, when it is determined that the reception levels of both portions are different from each other, the radio receiving apparatus of this embodiment performs the same operation as that of Embodiment 1.

As mentioned above, according to this embodiment, in the case where the reception levels of both portions become the same as each other, the comparison/selection and the measurement of the reception level of the pilot portion are omitted, and this makes it to reduce the amount of processing without decreasing the accuracy of AGC.

Additionally, this embodiment has explained the configuration in which the measurement of the reception level of the pilot portion is omitted. However, it is possible to use the configuration in which the measurement of the reception level of the data portion is omitted in the case where the reduction of a processing amount is more important than the accuracy of AGC.

As explained above, according to the present invention, it is possible to calculate such an appropriate level control value (AGC gain value) that prevents occurrence of clipping to perform demodulation correctly even if portions each having a different reception level exist in a transmission unit (one slot).

Additionally, the above has explained the case in which the data portion and the pilot portion exist in one slot, the present invention can be similarly applied to the case in which the data portion and a mid-amble portion in one slot.

This application is based on the Japanese Patent Application No. 2000-039544, entire content of which is expressly incorporated by reference herein Industrial Applicability The present invention can be applied to a communication terminal apparatus and a base station apparatus used in a digital radio communication system, particularly a CDMA/TDD radio communication system.

What is claimed is:

1. A radio receiving apparatus comprising:
   a receiver for receiving a signal including a first portion and a second portion each having a different reception level;
   a measure for measuring a reception level of the first portion and a reception level of the second portion;
   a compare/selector for comparing the reception level of the first portion with the reception level of the second portion to select a higher reception level; and
   a calculator for calculating a level control value using the reception level selected by said compare/selector, wherein
   said receiver controls the level of the signal including the first portion and the second portion in accordance with the level control value.

2. The radio receiving apparatus according to claim 1, wherein
   said receiver sets, the level of the signal including the first portion and the second portion to be within an input allowable level of A/D conversion.

3. The radio receiving apparatus according to claim 1, further comprising
   a determiner for determining whether or not the reception level of the first portion and that reception level of the second portion are the same as each other, wherein
   said calculator calculates the level control value using either the reception level of the first portion or the reception level of the second portion when said determiner determines that the reception level of the first portion and the reception level of the second portion are the same as each other.

4. The radio receiving apparatus according to claim 1, wherein
   said receiver receives a signal in which the first portion is a data portion and the second portion is a pilot portion.

5. The radio receiving apparatus according to claim 1, wherein
   said radio receiving apparatus is used in a TDD radio communication system.

6. A communication terminal apparatus having a radio receiving apparatus, said radio receiving apparatus comprising:
   a receiver for receiving a signal including a first portion and a second portion each having a different reception level;
   a measure for measuring a reception level of the first portion and a reception level of the second portion;
   a compare/selector for comparing the reception level of the first portion with the reception level of the second portion to select a higher reception level; and
   a calculator for calculating a level control value using the reception level selected by said compare/selector, wherein
   said receiver controls the level of the signal including the first portion and the second portion in accordance with the level control value.

7. A base station apparatus having a radio receiving apparatus, said radio receiving apparatus comprising:
   a receiver for receiving a signal including a first portion and a second portion each having a different reception level;
   a measure for measuring a reception level of the first portion and a reception level of the second portion;
   a compare/selector for comparing the reception level of the first portion with the reception level of the second portion to select a higher reception level; and
   a calculator for calculating a level control value using the reception level selected by said compare/selector, wherein
   said receiver controls the level of the signal including the first portion and the second portion in accordance with the level control value.

8. A radio receiving method comprising the steps of:

receiving a signal including a first portion and a second portion each having a different reception level;

measuring a reception level of the first portion and a reception level of the second portion;

comparing the reception level of the first portion with the reception level of the second portion to select a higher reception level;

calculating a level control value using the selected reception level; and controlling the level of the signal including the first portion and the second portion in accordance with the level control value.

* * * * *